United States Patent [19]
Tsai et al.

[11] Patent Number: 5,799,994
[45] Date of Patent: Sep. 1, 1998

[54] WAFER HANDLING TOOL WITH VACUUM PICKUP

[75] Inventors: Poyueh Tsai, Peng-dong; Rea-Chang Wang, Hsin-Chu; Te Yun Liu, Hwa-Shing; Y. F. Lin, Chin-chu, all of Taiwan

[73] Assignee: Taiwan Semiconductor Manufacturing Company, Ltd., Hsinchu, Taiwan

[21] Appl. No.: 862,798

[22] Filed: May 23, 1997

[51] Int. Cl.$^6$ .................................................. B25J 15/06
[52] U.S. Cl. ............................................................ 294/64.1
[58] Field of Search .......................... 294/1.2, 64.1–64.3, 294/88; 29/743, 758; 414/941; 269/21

[56] References Cited

U.S. PATENT DOCUMENTS

| | | | |
|---|---|---|---|
| 1,735,287 | 11/1929 | Lehmann | 294/64.1 |
| 1,773,498 | 8/1930 | Raymond | 294/64.1 |
| 2,224,575 | 10/1940 | Montalvo-Guenard | 294/64.1 |
| 2,274,304 | 2/1942 | Perry | 294/64.1 |
| 3,337,897 | 8/1967 | Lerner et al. | 294/64.1 |
| 3,424,486 | 1/1969 | Corley | 294/1.2 |
| 4,050,729 | 9/1977 | Hutson | 294/64.1 |
| 4,397,491 | 8/1983 | Anderson | 294/64.1 |
| 5,217,273 | 6/1993 | Hendricsen et al. | 294/64.1 |
| 5,374,090 | 12/1994 | Goff | 294/64.1 |

FOREIGN PATENT DOCUMENTS

| 2611-563 | 9/1988 | France | 294/64.1 |
|---|---|---|---|

*Primary Examiner*—Dean Kramer
*Attorney, Agent, or Firm*—George O. Saile; Stephen B. Ackerman; William S. Robertson

[57] ABSTRACT

A hand operated tool for picking up a semiconductor wafer includes a vacuum cylinder with a piston. The user first pushes the piston to its forward most position against the force of a spring and a catch mechanism locks the piston in this position. Later, the user presses a button to release the catch mechanism and allow the piston to move to its rear most position in response to the force of the spring. The motion of the piston creates a suitable vacuum in the front part of the cylinder. A vacuum head is attached to the forward end of the cylinder. It has a generally square flat surface with sides about one third the diameter of a wafer. The user positions this surface in contact with a wafer and then pushes the button to releases the piston and apply a vacuum to grasp the wafer. The user moves the wafer to its destination and then presses a second button to allow air to enter the vacuum side of the cylinder and thereby release the grasp on the wafer.

9 Claims, 1 Drawing Sheet

WAFER HANDLING TOOL WITH VACUUM PICKUP

FIELD OF THE INVENTION

This invention relates generally to a hand held tool for grasping a thin rigid structure, particularly a semiconductor wafer. More specifically this invention relates to wafer pickup tool with a vacuum grip for the wafer.

INTRODUCTION

In the development and/or manufacture of semiconductors, it is a common occurrence that a semiconductor wafer is picked up manually, moved to a destination, and then released.

The wafer processing steps are performed on the back surface of the wafer, and it is a general object in semiconductor manufacturing to prevent this surface from becoming damaged or contaminated with dirt. Accordingly, when a wafer is laid flat on a supporting surface, the back of the wafer contacts the surface and the top surface faces up.

An operation of this type takes a few seconds to at most a few minutes.

At several points in the normal processing of wafers, a wafer is supported on a flat surface with about one third of the diameter of the wafer extending past the edge of the surface and unsupported. Manufacturing or development people can easily grasp the wafer between the thumb and fingers on one hand. Alternatively, a wafer on a flat surface can be safely pushed into a position to be grasped in this way.

THE PRIOR ART

Goff U.S. Pat. No. 5,374,090 teaches a battery and a vacuum pump that are mounted in hand held housing. When the motor is turned on, the vacuum pump applies suction to a wand that grasps a wafer. A thumb operated button on the housing controls the motor.

Goff also describes a prior art system in which vacuum pick up wands are connected by flexible vacuum tubing to a permanently installed vacuum line. Goff also describes the prior art use of tweezers to pick up a wafer. Golf also discusses some of the objects of developments in this art.

Hendricsen U.S. Pat. No. 5,217,273 discusses the difficulty in achieving a suitable vacuum and teaches a battery operated hand held device with two vacuum pumps connected in series. Hendricsen also discusses some of the objects of developments in this art.

SUMMARY OF THE INVENTION

This invention provides a new and improved vacuum pickup tool for handling a wafer. A more specific object of the invention is to avoid the electric motors of the prior art and thereby avoid the problems with a battery operated pickup tool. The tool is operated manually and is always ready for use without recharging or exchanging a battery.

The new features of the tool can be summarized easily by describing the components of the tool as they appear in an operation to pick up a wafer.

This wafer pickup tool has a cylinder that carries a piston. A piston rod extends between the piston to a handle located beyond the end of the cylinder. The diameter of the cylinder is suitable for a person using the tool to hold the cylinder in one hand (the right hand for a right handed person). The user can grasp the handle with the other hand in an initial operation to use the tool In this initial operation, the user pushes the piston forward against the force of a spring that is located inside the cylinder between the piston and a rear wall of the cylinder. (Later it will be seen that the spring is on the side of the piston that is at atmospheric pressure.)

When the user has pushed the piston to its forward most position, a catch mechanism locks the piston in its forward most position. A thumb operated button for releasing the catch is located at a convenient position on the outer surface of the cylinder. The catch is formed in part by a cavity in the piston and a spring loaded block that moves radially (with respect to the axis of the cylinder) inside the cavity. When the piston is in its forward most position, the block moves radially outward into a locking engagement with a support structure for the button. When the person using the tool depresses the button, the block moves out of the support, the piston is released, and the piston is spring driven rapidly to the rear of the cylinder and thereby creates a vacuum in the front of the cylinder.

A vacuum pick up head is located in front of the cylinder. It has an upper surface that can be located in close proximity to an exposed surface of a wafer. This surface of the tool has an opening that communicates with the forward end of the vacuum cylinder so that a vacuum appears at the opening when the piston is released. The opening is preferably circular and is large enough to provide a vacuum grip on a wafer. A resilient ring around the opening helps to seal the wafer to the tool.

The user positions the pickup head to grasp the wafer, pushes the button to release the piston. The resulting vacuum holds the wafer to the pickup head. The pickup head is made of a material (e.g. PTFE) that tends to not attract dirt and can be cleaned easily.

The button of a vacuum release mechanism is located near the catch button and the user operates the vacuum release button to release the grip of the tool on the wafer when the wafer has been positioned as desired.

The detailed description of a preferred embodiment of the invention will describe other features of the invention and corresponding objects and advantages of the invention.

THE DRAWING

THE PREFERRED EMBODIMENT

INTRODUCTION

Figure 1:
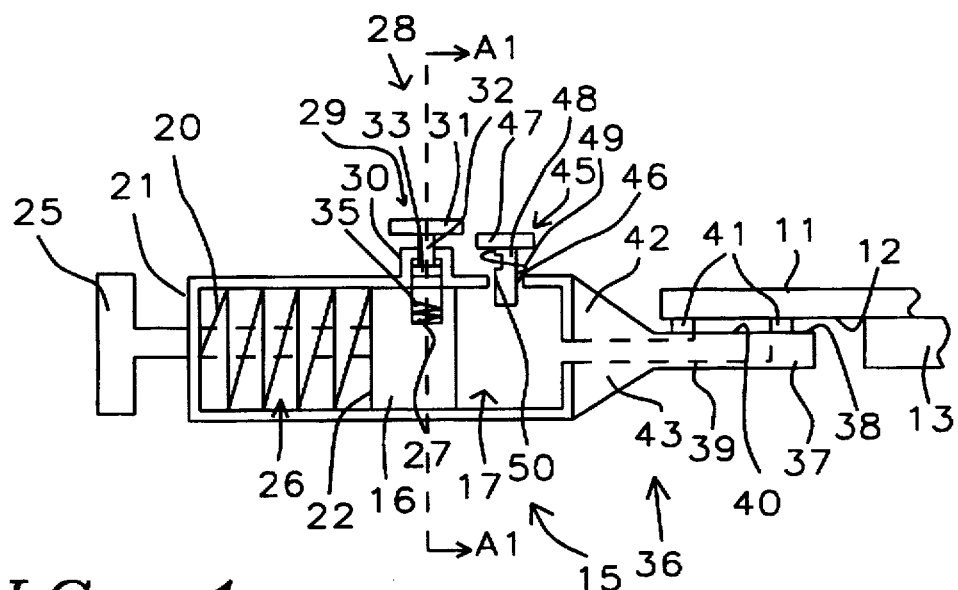
FIG. 1 is a side view in section of the pickup tool of this invention.
Figure 2:
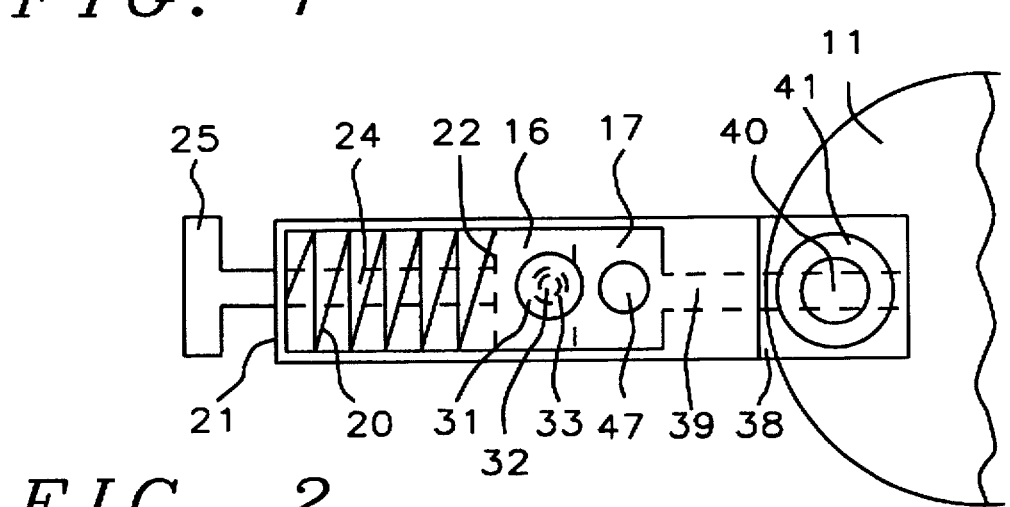
FIG. 2 is a top view in section of the pickup tool of FIG. 1.

FIGS. 1 and 2 show a semiconductor wafer 11 that is to be picked up by the tool of this invention. The wafer is conventionally circular but the drawing shows only a portion of the left side of the wafer which is closest to the pickup tool.

The wafer is supported in such a way that a substantial portion of the underneath side 12 is accessible to the wafer pickup tool, as is customary when a wafer it to be picked up by other means, for example manually by a person wearing gloves.

FIG. 2 shows the wafer resting on a supporting surface 13 with the top of the wafer facing up and the back 12 facing down and with part of the wafer overhanging the edge of the support. Equivalently, the wafer can be supported in a multi-wafer cassette in which the wafers are spaced apart coaxially and a surface area is exposed to the pickup tool in the way represented in FIG. 2. The operation of the tool will usually be described for the horizontal position shown in the drawing, but the tool can be used with a wafer in any position, as will be understood without specific explanation.

The Vacuum Pump

The tool includes a cylinder 15 and a piston 16 that rides inside the cylinder. The cylinder has a diameter to be easily held in one hand in the operations that will be described. Piston 16 rides axially inside cylinder 15 and, as will be explained, FIGS. 1 and 2 show the piston in a position from which it can be released to move to the rear of the housing (to the left in the drawing). When the piston is in this position, the spaces on either side of the piston are at atmospheric pressure, and when the piston moves to the rear of the housing it pumps a vacuum in the side of cylinder 17 nearest the wafer, the right side in FIGS. 1 and 2.

The inside surface 18 of the cylinder is smooth and the piston has a sealing relation with the cylinder walls. The seal is sufficient to hold a vacuum in the vacuum side of the cylinder for a time that is suitable for grasping a wafer and moving it to its destination in an intended application. The art of piston seals is well developed and the drawing shows the seal only schematically.

A spring 20 is located inside the cylinder and attached at its rear to the cylinder end part 21 and attached at its front end to the rear face 22 of the piston. A piston rod 24 extends from an axial position at the rear of the piston, along the axis of spring 20, to a distance suitable beyond the end of the cylinder. The cylinder end part 21 is adapted to position the piston rod along the axis of the cylinder.

A handle 25 is attached at the rear of the piston rod 24 and allows the user to push the piston forward against the force of the spring. The spring stores energy for driving the piston rapidly to the rear for producing a vacuum.

Locating the spring in the space 26 to the rear of the piston saves space in the vacuum side 17 of the cylinder (which would otherwise be taken by a compression spring). It also simplifies replacing the spring; (the rod supporting end 21 of the cylinder is preferably removable). Also, the forward face of the piston is kept clear of the spring and is adaptable to various sealing mechanisms.

The Catch Mechanism

A catch mechanism 28 releasably holds the piston in its forward position against the force of spring 20. The catch mechanism includes a button 29 that is slidably mounted in a support 30 located at the top of the cylinder. Button 29 has an upper part 31, a stem 32 and a lower part 33. The stem 32 and support 30 cooperate to guide the button in vertical movement. The wall of the cylinder has an opening inside support 30 and when the button is depressed, the lower part 33 can extend downward far enough for its lower surface to be substantially continuous with the inside wall of the cylinder. FIG. 1 shows this lower surface about level with the upper surface of the cylinder, just above its lowest position (and just above its highest position, as described later).

Figure 3:
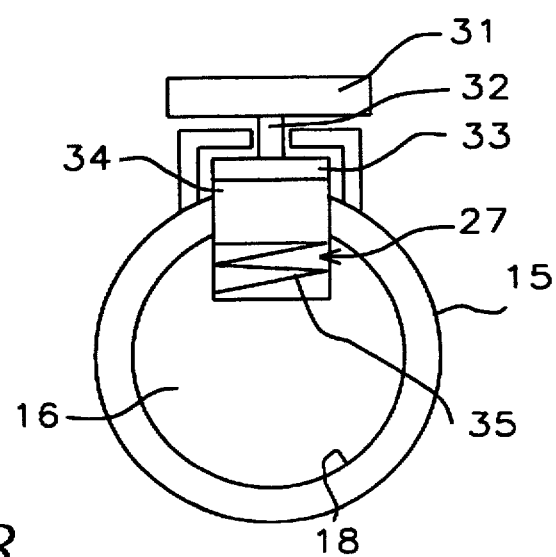
FIG. 3 is a section view of FIG. 1 along line A1-A1 in FIG. 1.

A cavity 27 is formed in piston 16 at a location to underlie button 29 when the piston is in its forward position (the position shown in FIGS. 2 and 3). A block 34 is positioned in cavity 27 and rides up and down in the cavity, as will be explained. Block 34 and cavity 27 may be given any suitable shape, but preferably they are each cylindrical on a common axis that is radial with respect to the axis of cylinder 15. (This axis is vertical in the normal operating position of the tool that FIGS. 2 and 3 show.)

A spring 35 urges block 34 radially outward. When the piston is to the rear of the position shown in FIG. 1, the upper surface of the block bears slightly against the inside wall 18 of the cylinder. When the piston is in the position of FIG. 1, the spring pushes the block into the opening formed by support 30 and the block locks the piston in this position. When the user pushes the button downward, the button pushes the block out of support 30 and thereby releases the piston for axial movement.

The upward motion of the block is limited by contact between the upper surface of lower part 33 and the corresponding surface of the support. These surfaces are separated in the drawing to show the position of the button after the start of its downward motion (and to make the parts easier to see.)

At the beginning of an operation with the tool, the catch is released and spring 20 holds the piston in its rear most position. A user holds the cylinder 15 with one hand (without depressing button 29), grasps the handle 25 with the other hand, and pushes the piston forward until spring 35 pushes block 34 into engagement with support 30 and thereby locks the piston against further motion in either direction. When the user depresses button 29, spring 20 drives piston 16 rapidly to the rear and produces a vacuum in part 17 of the cylinder.

The Vacuum Head

A vacuum head 36 is located ahead of the cylinder and is adapted to grasp a wafer with the vacuum in side 17 of the cylinder. The vacuum head includes a part 37 that underlies the wafer and has a flat upper surface 38 that the user brings into a sealing contact with the wafer. Part 37 has an internal channel 39 that communicates with the vacuum side 17 of the cylinder.

The upper surface 38 has an opening 40 where the vacuum is applied to the wafer. Preferably, opening 40 is circular and a sealing ring 41 (preferably rubber) is located at the periphery of the opening to improve the seal.

The mechanical connection of vacuum head 36 to cylinder 15 includes upper and lower wedges 42, 43 that help to support part 37. Parts 37, 43 and 43 have been described as separate components of vacuum head 36 but preferably form a unitary structure.

The Vacuum Release

A mechanism 45 is operated when the user is ready to release the wafer. A circular opening 46 is formed in the upper surface of the cylinder in a location to admit air to the vacuum side 17 of the cylinder. The mechanism includes a thumb rest 47, a stem 48 and a spring 49. The stem extends through opening 46 and is movable between a raised position (shown in FIG. 1) and a depressed position. The stem is cylindrical and the stem lower part seals the hole. The upper part of the stem has a recess 50 that admits air when the mechanism is depressed. Spring 49 ordinarily raises the mechanism to its sealing position. The upward travel of the mechanism is limited in any suitable way, for example by flaring the lower end of the stem.

As FIG. 1 shows, the wall of the cylinder is thick enough to guide the stem in its vertical motion and recess 50 is long enough to allow air to enter the cylinder when the mechanism is depressed. The cylinder wall will ordinarily be thick enough for this purpose or it can be made thicker in the region of opening 46.

Other Embodiments

From the description of a preferred embodiment of the invention, those skilled in the art will recognize modifications within the spirit of the invention and the intended scope of the claims.

We claim:

1. A tool for picking up a thin flat object, comprising, an open cylinder (15), the directions along the axis of the cylinder being arbitrarily designated forward and rear, a piston (16) adapted to ride inside the cylinder between a rear most position and forward most position, the cylinder having a smooth inside wall (18) and the piston having an air sealing relation to said inside wall, a hand graspable means (24, 25) attached to the piston for manually moving the piston to its forward position, the hand graspable means comprising a rod (24) having a forward end and a rearward end, the forward end being attached to the piston, the rear end extending outside the cylinder, a handle (25) that is graspable by a user of the tool attached to the rearward end of the rod, the cylinder including means (21) guiding the rod (24) to slide axially with respect to the cylinder, an expansion spring (20) for urging the piston to its rear most position, the spring being mounted to the rear of piston and adapted to be expanded when the piston is moved from its rear most position to its forward most position, a manually operable catch mechanism (28) for holding the piston in its forward position against the force of the spring, and means for manually releasing the catch mechanism for allowing the spring to return the piston rapidly to its rear position and thereby produce a vacuum in the cylinder space (17) forward of the piston, the catch mechanism including a thumb operable button (29) mounted in the upper part of the cylinder where it is easily depressed and held by the user of the tool, using the hand holding the cylinder, the piston having a cavity (27) for holding a block (34) and a spring (35) urging the block radially outward with respect to the axis of the cylinder and wherein means (30) is located on the outside of the cylinder for receiving the block for locking the piston in its forward most position, a vacuum pickup part (36) attached to the forward end of the open cylinder for applying the vacuum in the cylinder to grasp the object, and means for releasing the vacuum to release the grasp on the object.

2. The tool of claim 1 wherein the vacuum pickup part (36) has a part with a flat upper surface (38) adapted to be brought into contact with a surface of the object being picked up, and the flat upper surface has an opening (40) that is sealed by contact with the object, whereby a vacuum created in the cylinder is applied to grasp the object, and a compliant seal (41) is located around the opening (40) for sealing the object to the tool, the flat upper surface being located in a plane of the axis of the cylinder, and being adapted to extend radially past the edge of the wafer by about one third of the diameter of the wafer, and wherein the part (37) containing the opening and the seal is connected to the cylinder by upper and lower wedge shaped parts (42, 43), the wedge shaped parts being symmetrical with respect to said plane of the axis of the cylinder.

3. The tool of claim 2 wherein the tool is adapted to be held in a position with the axis of the cylinder generally horizontal and wherein the catch mechanism (28) is located on the upper surface of the cylinder.

4. The tool of claim 3 wherein the compliant seal is circular.

5. The tool of claim 4 wherein the opening in the upper surface of the vacuum pickup part is circular and substantially equal in diameter to the inside diameter of the seal.

6. The tool of claim 5 wherein the object is a circular semiconductor wafer and wherein the width of the vacuum pickup part is approximately one third the diameter of the wafer.

7. The tool of claim 5 wherein a part (37) of the vacuum pickup part contains the opening (40) and the seal (41) and is adapted to extend radially past the edge of the wafer by about one third of the diameter of the wafer.

8. The tool of claim 1 wherein the catch mechanism includes a button mounted to move radially with respect to the cylinder axis in the means (30) for receiving the block for moving the block out of the block receiving means and thereby releasing the piston to move to its rear most position.

9. The tool of claim 8 wherein the means for releasing the vacuum includes a button (45) mounted on the upper surface of the cylinder in a position to be operated with the hand holding the tool.

* * * * *